United States Patent [19]

Ogura et al.

[11] Patent Number: 4,641,170

[45] Date of Patent: Feb. 3, 1987

[54] SELF-ALIGNED LATERAL BIPOLAR TRANSISTORS

[75] Inventors: Seiki Ogura, Hopewell Junction; Jacob Riseman, Poughkeepsie; Nivo Rovedo, Poughquag; Joseph F. Shepard, Hopewell Junction, all of N.Y.

[73] Assignee: International Business Machines Corporation

[21] Appl. No.: 762,669

[22] Filed: Aug. 5, 1985

Related U.S. Application Data

[62] Division of Ser. No. 560,629, Dec. 12, 1983, Pat. No. 4,551,906.

[51] Int. Cl.$^4$ ............................................. H01L 29/72
[52] U.S. Cl. ........................................ 357/35; 357/34; 357/68; 357/71
[58] Field of Search .................... 357/34, 35, 71, 715, 357/68, 675, 59 H, 59 I, 59 J, 59 K

[56] References Cited

U.S. PATENT DOCUMENTS

| | | | |
|---|---|---|---|
| 4,080,618 | 3/1978 | Tango et al. | 357/68 X |
| 4,209,350 | 6/1980 | Ho et al. | 357/59 X |
| 4,259,680 | 3/1981 | Lepselter et al. | 357/35 X |
| 4,263,058 | 4/1981 | Brown et al. | 357/715 X |
| 4,276,557 | 6/1981 | Levinstein et al. | 357/715 X |
| 4,476,482 | 10/1984 | Scott et al. | 357/59 I X |
| 4,492,008 | 1/1985 | Anantha et al. | 357/35 X |
| 4,507,171 | 3/1985 | Bhatia et al. | 357/65 X |
| 4,507,853 | 4/1985 | McDavid | 357/68 X |
| 4,542,577 | 9/1985 | Jackson | 357/65 X |

FOREIGN PATENT DOCUMENTS 0083816  7/1983  European Pat. Off. ............. 357/59

OTHER PUBLICATIONS

Antipov, I., "Method for Making Lateral PNP Devices" IBM Tech. Disc. Bull., vol. 24, No. 3, 8/81, pp. 1745-1746.

*Primary Examiner*—Martin H. Edlow
*Assistant Examiner*—Sara W. Crane
*Attorney, Agent, or Firm*—William T. Ellis

[57] ABSTRACT

An integrated circuit structure which includes small area lateral bipolar and method for making the same is described. A semiconductor body, such as a monocrystalline silicon wafer, having surface regions thereof isolated from other such regions by a pattern of dielectric isolation is provided. At least two narrow widths PN junction regions are located within at least one of the surface regions. Each PN junction has a width dimension substantially that of its electrical contact. Substantially vertical conformal conductive layers electrically ohmic contact each of the PN junction regions. The PN junction regions are the emitter and collector regions for a lateral bipolar transistor. A base PN junction base region of an opposite conductivity is located between and contiguous to the emitter and the collector junctions. Substantially horizontal conductive layers are in electrical contact with an edge of each of the vertical conductive layers and separated from the surface regions by a first electrical insulating layer. A second insulating layer covers the conformal conductive layers. The horizontal conductive layer is patterned so as to have electrically separated conductive lines from one another. A third electrical insulating layer is located over the patterned horizontal conductive layers. An electrical ohmic contact is made to each of the horizontal conductive layers through an opening in the third electrical insulating layer which effectively makes electrical contacts to the emitter and collector regions through the patterned horizontal conductive layers and the vertical conductive layers. An electrical ohmic contact is made to the centrally located base region which contact is separated from the vertical conductive layers by the second insulating layer.

8 Claims, 21 Drawing Figures

SELF-ALIGNED LATERAL BIPOLAR TRANSISTORS

This application is a divisional of application Ser. No. 06/560,629 filed Dec. 12, 1983, now U.S. Pat. No. 4,551,906.

TECHNICAL FIELD

Invention relates to methods for forming self-aligned lateral bipolar transistors and more particularly to forming such devices and making electrical contact thereto.

CROSS REFERENCE TO RELATED APPLICATIONS

U.S. Pat. No. 4,546,535 issued Oct. 15, 1985, entitled "Submicron FET Structure and Method of Making" by J. F. Shepard. Patent application Ser. No. 755,027 filed July 12, 1985 entitled "Method of Making Submicron FET Structure" by J. F. Shepard.

BACKGROUND ART

Integrated circuits have substantially increased in complexities over the years. The technology is moving towards smaller and smaller device structures. The extension of the technology to obtain narrow line widths in the range of 1 micrometer or less by extending conventional photolithography techniques such as electron beam, ultraviolet light, or X-ray lithography is becoming more difficult and expensive.

Other narrow device structure techniques have been developed to overcome this problem. One such technique is described in H. B. Pogge in IBM Technical Disclosure Bulletin, November 1976, Vol. 19, No. 6, pgs. 2057-2058 entitled "Narrow Line Widths Masking Methods". This method involves the use of a porous silicon followed by the oxidation of the porous silicon. Another technique is described by S. A. Abbas et al., in the IBM Technical Disclosure Bulletin, September 1977, Vol. 20, No. 4, pgs 1376-1378. This method describes the use of polycrystalline silicon masking layers which are made to mask by first using an intermediate mask of oxidation blocking material, such as silicon nitride in the formation of the polycrystalline silicon. Line dimensions below about 2 micrometers may be obtained by this technique.

Methods for forming narrow dimensioned, for example, sub-micrometer regions on the silicon body are disclosed by U.S. Pat. Nos. 4,209,349 and 4,209,350 by I. T. Ho et al., and U.S. Pat. No. 4,234,362 by J. Riseman. These patents involve the formation of substantially horizontal surfaces and substantially vertical surfaces on the silicon body and then forming a vertical layer of a very narrow dimension on the substantially vertical surfaces. This layer may be formed by initially depositing a very narrow dimensioned layer on both the substantially horizontal and substantially vertical surfaces followed by an anisotropic reactive ion etching process to remove the horizontal layer while leaving the vertical layer substantially intact. The vertical layer dimension is adjusted depending upon the original thickness of the layer applied. Alternatively, the vertical layer may be formed by the oxidation of a side edge of a polysilicon layer which has its top surface masked by a oxidation resistant coating such as silicon nitride as described in the S. G. Barbee et al., IBM Technical Disclosure Bulletin, Aug. 19, 1982, Vol. 25, No. 3B, pgs. 1448-1449 or as shown in the H. B. Pogge, U.S. Pat. No. 4,256,514. In these ways a narrow dimension region of one micrometer or less may be obtained.

A further major related problem in the very dense integrated circuit technology is how to electrically contact the various elements and devices of such narrow dimensions in the integrated circuit. It is known to use highly doped polycrystalline silicon as a source of a dopant for regions of monocrystalline silicon to form PN junctions therein. The polycrystalline silicon can either be removed or allowed to become part of the device as the electrical contact for the region formed by the out-diffusion from the polycrystalline silicon. Such processes are taught, for example by D. M. Duncan, U.S. Pat. No. 3,978,515; J. H. Scott, Jr., U.S. Pat. No. 3,460,007; D. M. Duncan, U.S. Pat. No. 3,664,896; S. Tauchi et al., U.S. Pat. No. 3,484,313 and the aforementioned I. T. Ho et al., U.S. Pat. No. 4,209,350. However, these patents are either silent on the method for the next level metallurgy to the electrical contact or have a second level metallurgy directly above the polycrystalline silicon electrical contact to the PN junction.

Other workers in the field have addressed the electrical contact in other ways, such as U.S. Pat. No. 3,600,651, by providing lateral polycrystalline silicon contacts to a monocrystalline silicon active region. The polycrystalline silicon is then contacted at a more convenient location laterally away from the active region. N. G. Anantha et al., U.S. Pat. No. 4,236,294 also uses the technique of a polycrystalline silicon contact to a PN junction and then a contact to the polycrystalline layer at some convenient distance laterally away from that PN junction. The H. S. Bhatia et al., patent application Ser. No. 405,844 filed Aug. 6, 1982 entitled "Method For Contacting A Narrow Width PN Junction Region and Resulting Structure" describes further methods for making contact to a narrow width PN junction region by electrically contacting a horizontal conductive layer at a convenient location. The horizontal conductive layer in turn contacts a vertical conductive layer which makes contact to the element of the integrated circuit.

It is an object of the present invention to provide methods and resulting structures for forming a lateral bipolar transistor which is even smaller than those envisioned in the prior art technologies.

It is further object of the invention to describe methods of forming closely spaced openings to a semiconductor surface which may in turn be utilized to form elements in the semiconductor surface for use in very dense integrated circuit structures.

SUMMARY OF THE PRESENT INVENTION

In accordance with the present invention, an integrated circuit structure which includes small area lateral bipolar transistors is described. A semiconductor body, such as a monocrystalline silicon wafer, having surface regions thereof isolated from other such regions by a pattern of dielectric isolation is provided. At least two narrow width PN junction regions are located within at least one of the surface regions. Each PN junction has a width dimension of substantially that of its electrical contact. Substantially vertical conformal conductive layers electrically ohmic contact each of the PN junction regions. The PN junction regions are the emitter and collector regions for a lateral bipolar transistor. A base PN junction base region of an opposite conductivity is located between and contiguous to the emitter and the collector junctions. Substantially horizontal conductive layers are in electrical contact with an edge of each of the vertical conductive layers and separated from the surface region by a first electrical insulating layer. A second insulating layer covers the conformal conductive layers. The horizontal conductive layer is patterned so as to have electrically separated conductive lines from one another. A third electrical insulating layer is located over the patterned horizontal conductive layers. An electrical ohmic contact is made to each of the horizontal conductive layers through an opening in the third electrical insulating layer which effectively makes electrical contacts to the emitter and collector regions through the patterned horizontal conductive layers and the vertical conductive layers. An electrical ohmic contact is made to the centrally located base region which contact is separated from the vertical conductive layers by the second insulating layer.

A method for forming the device described in the preceding paragraph involves first providing a monocrystalline semiconductor body whose at least one surface region is of a first conductivity. An insulating layer is formed over the surface region. A substantially horizontal first conductive layer is formed over the insulating layer. The conductive layer is then patterned by conventional lithography and etching techniques. These layers are then further masked and etched to provide openings in the layers to the semiconductor body where the emitter and collector regions of the desired lateral bipolar device are to be formed. The openings have substantially vertical surfaces on the layered structure. A conformal highly doped of a second conductivity conductive layer is formed over this surface with the openings having substantially vertical surfaces. The conformal conductive layer is etched to substantially remove the horizontal portions of the conformal layer while leaving the openings filled with the conformal coating. The insulating and first conductive layers are again masked and etched to provide openings to the semiconductor body where the base region of the lateral bipolar device is desired to be formed between the vertical conformal conductive layers. The structure is heated at a suitable temperature to cause the dopant of a second conductivity to diffuse into the body from the conformal conductive layer to form PN junction regions for the emitter and collector regions. An insulator is formed over the vertical conformal conductive layer. A third highly doped conductive layer of a first conductivity is formed in contact with the semiconductor body where the base regions are to be formed. The body and layered structure is heated at a suitable temperature to cause the dopant of a first conductivity to diffuse into the body from the third conductive layer to form PN junction regions between the emitter and collector regions. Electrical emitter and electrical ohmic contacts are made to the patterned first conductive layer through the insulator which contact effectively makes electrical contact to the narrow width PN junction emitter and collector regions through the respective first conductive layer and the vertical conformal conductive layer. Electrical ohmic contacts are made to the base region through the third conductive layer.

A method is described to form closely spaced openings to a semiconductor surface for the formation of elements of integrated circuits in that surface. A series of layers are formed upon the monocrystalline semiconductor body which include an insulating layer on the surface, a first conductive layer, a first silicon dioxide layer, a first silicon nitride layer, a first polysilicon layer, a second silicon nitride layer which is substantially thicker than the first silicon nitride layer, a second polysilicon layer, and a third silicon nitride layer. The third silicon nitride layer and second polysilicon layer are patterned and the exposed edge of the second polysilicon layer is oxidized to produce a first silicon dioxide sidewall above where a designated central region in the semiconductor body is desired to be formed. The remaining third silicon nitride layer and second polysilicon layer are removed to leave the first silicon dioxide sidewall on the surface. All portions of the first silicon dioxide sidewall are removed except that portion thereof which is over the designated central region between the designated closed spaced openings. A first organic polymeric material is deposited onto the second silicon nitride layer and used to planarize the surface with the first sidewall. The sidewall, second silicon nitride layer thereunder and first polysilicon layer thereunder are removed by anisotropic reactive ion etching. The first polymeric material is then removed. The sides of the exposed first polysilicon layer are oxidized to form a second silicon dioxide sidewall over the designated closely spaced openings over the semiconductor body. A second organic polymeric material is deposited onto the upper surfaces of the first silicon dioxide layer and to fill the opening within the second sidewall. The portions of the second sidewall, said first silicon nitride layer, said second silicon dioxide layer above the designated closely spaced openings are removed by anisotropic reactive ion etching. The second organic material, the remaining first polysilicon layer and the insulating and first conductive layers are removed to give the openings having substantially vertical surfaces down to the semiconductor surface. This intermediate structure may be utilized in the formation of elements within the semiconductor body such as PN junctions or the like.

BRIEF DESCRIPTIONS OF THE DRAWINGS

The drawings show the following:

DISCLOSURE OF THE INVENTION

Figure 1:
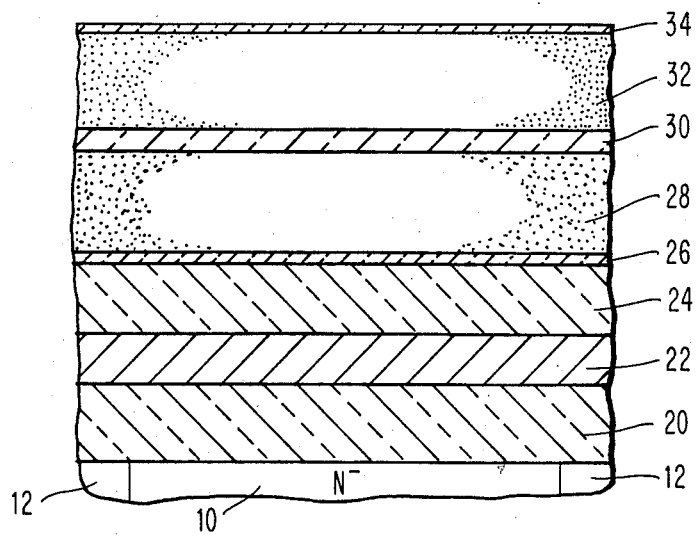
FIGS. 1 through 15B are schematic, greatly enlarged cross-sectional illustration for the method of one embodiment of the invention for making a very small lateral NPN bipolar transistor integrated circuit.

Referring now more particularly to FIG. 1 there is illustrated an embodiment for forming lateral NPN bipolar transistors. The FIG. 1 illustrates one small and, greatly enlarged portion of the silicon body which will be used to form a very dense, high performance bipolar integrated circuit. However, it will be understood by workers in the art that semiconductor materials other than monocrystalline silicon can be used in conjunction with this process. A P— substrate of monocrystalline silicon with an epitaxial N— layer 10 is then grown on top of the substrate. These processes are standard processes in the formation of, for example, bipolar transistors. The substrate is typically a <100> crystallographic orientation silicon wafer having a resistance of about 10 to 20 ohm-cm. The epitaxial growth process to form layer 10 may be by conventional techniques, such as the use of silicon tetrachloride/hydrogen or silane mixtures at temperatures of between about 1000° C. to 1200° C. The thickness of the epitaxial layer for highly dense integrated circuits is of the order of 3 micrometers of less.

The next series of steps in this embodiment involve the formation of isolation regions of monocrystalline silicon from other regions of monocrystalline silicon. The isolation may be back-biased PN junctions, partial dielectric isolation or complete dielectric isolation. The dielectric materials used may be silicon dioxide, silicon nitride, other glasses, etc. The preferred isolation for highly dense integrated circuits is dielectric isolation. FIG. 1 shows partial dielectric isolation with dielectric regions 12 together with the P+ region isolating monocrystalline silicon regions of the silicon body from one another. There are many ways in the art to form dielectric isolation regions of this type. It is preferred to use the process described in the Magdo et al patent application Ser. No. 150,609 filed June 7, 1971 or Peltzer U.S. Pat. No. 3,648,125. Alternately, the process described in the J. A. Bondur et al., U.S. Pat. No. 4,104,086 can be used. In that patent application and patents the processes for forming partial dielectric isolation for the regions 12 are described in detail.

A silicon dioxide or other suitable insulator layer 20 is formed over the principal surface of the silicon semiconductor body. The layer 20 may be typically about 300 to 400 nanometers and is preferably of silicon dioxide. The silicon dioxide may be formed either by a thermal oxidation process or chemical vapor deposition process. This layer 20 may be thermally grown in an oxygen or oxygen-water vapor ambient at a temperature of about 970° C. A second method for growing silicon dioxide involves the use of chemical vapor deposition process wherein silane, and an oxygen source, such as $N_2O$ at a temperature of about 450° C. or $SiH_2Cl_2$ and $N_2O$ is reacted at a temperature of about 800° C. under atmospheric or low pressure conditions. Alternate insulating layers or combinations thereof may be formed in place of the silicon dioxide.

A first conductive layer 22 may be composed of a refractory metal such as molybdenum or tungsten, of a thickness of 200 to 300 nanometers or a refractory metal silicide. Alternatively, the film can be composed of the so-called polycide film that consists of a layer of metal silicide in combination with a layer or layers of polycrystalline silicon. Metal silicide layer thickness, for example, would range from about 150 to 500 nanometers for the horizontal conductive layer and about 50 to 500 nanometers for the conformal conductor layer. The polycide thickness would range from about 200 to 400 nanometers polycrystalline silicon and 150 to 500 nanometers metal silicide for the horizontal conductive layer and about 50 to 200 nanometers polycrystalline silicon and about 50 to 300 nanometers metal silicide for the conformal conductive layer.

Standard lithography and etching techniques are utilized to pattern the conductive layer 22, for its desired ultimate electrical connections. This process preferably produces substantially vertical sidewalls for the pattern by use of anisotropic reactive ion etching or plasma etching. FIG. 1 does not show this patterning of layer 22 because the Fig. is restricted to the small area where the lateral bipolar devices are being formed. The patterning of the first conductive layer is accomplished by a first mask at this time in the manufacturing process because this conductive layer will now be buried by layers of insulation and no further contact holes are necessary at the transistor level since electrical contact is made between individual transistors by this pattern of conductive layer.

A series of individual layers are now deposited one upon the other and then systematically removed and manipulated so as to form closely spaced openings to the semiconductor surface of the body 10. These openings in this particular first embodiment will be utilized to form the emitter and collector PN junctions of the lateral bipolar transistor device. The layered sequence on top of the first conductive layer is as follows: a first chemically vapor deposited silicon dioxide layer 24; a first chemically vapor deposited silicon nitride layer 26; a first polysilicon layer 28; a second chemically vapor deposited silicon nitride layer 30; a second polysilicon layer 32; and a third chemically vapor deposited silicon nitride layer 34. The preferred ranges of thicknesses of these layers is between about 150 to 600 nanometers the first silicon dioxide layer 24; between about 70 to 200 nanometers for the first silicon nitride layer 26; between about 200 to 600 nanometers for the first polysilicon layer 28; between about 70 to 250 nanometers for the second silicon nitride layer 30; between about 200 to 600 nanometers for the second polysilicon layer 32; and between about 50 to 200 nanometers for the third silicon nitride layer 34. The result of this deposition process is shown as FIG. 1.

The techniques for depositing these chemical vapor deposited silicon nitride and silicon dioxide layers and polysilicon layers are known in the art. The silicon nitride may be formed by conventional high or low pressure chemical vapor deposition using silane ($SiH_4$) and $NH_3$ or by plasma deposition. The silicon dioxide is formed by any standard method such as $SiH_4+N_2O$ or TEOS or plasma deposition. The polycrystalline silicon can be formed by for example using $SiH_4$ in a hydrogen ambient in a temperature range of about 500° to 1000° C. and preferably about 600° C.

Figure 2:
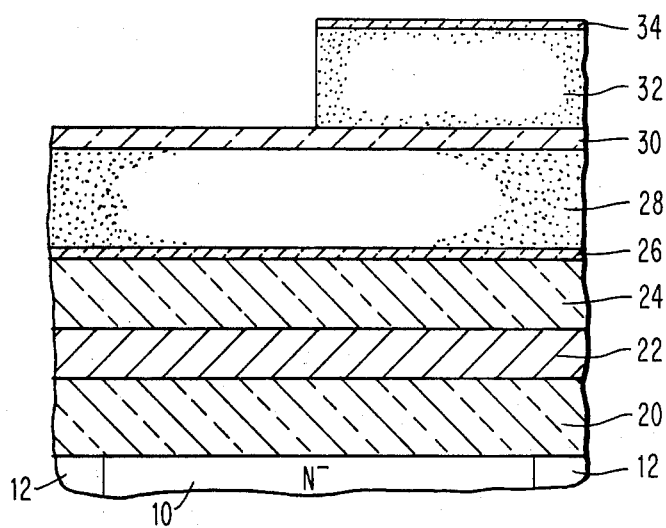

A second masking operation is utilized with lithography and etching techniques to pattern the third silicon nitride layer 34 and then the second polysilicon thereebeneath by a anisotropic etching process to obtain a substantially vertical sidewall for the layers 34 and 32 as shown in FIG. 2. The preferred anisotropic etching ambient for this etching of the silicon nitride and then the polysilicon is for $CF_4$ or $CHF_3$ for silicon nitride at suitable low pressures and for polysilicon thereabout is $CCl_2F_2+N_2+O_2$ or any chlorine containing atmosphere.

Figure 3:
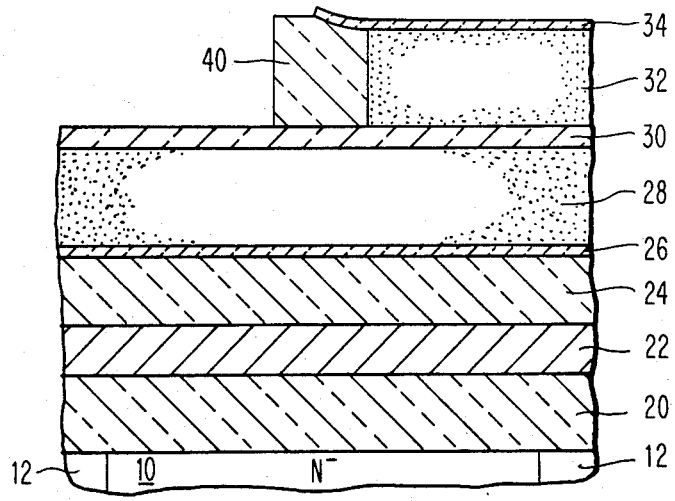

The FIG. 2 structure is now subjected to an oxidation ambient such as wet oxygen at 970° C. to form a first silicon dioxide sidewall in the range of between about 250 to 800 nanometers as shown in FIG. 3. During this oxidation the silicon nitride layer 34 acts as an oxidation barrier to prevent oxidation of the upper surface of the polysilicon layer 32. Alternatively, it is possible to form a sidewall by means of a uniform deposition by chemical vapor deposition of silicon dioxide onto the horizontal and the vertical surfaces followed by a anisotropic reactive ion etching step which will remove the horizontal portions of the silicon dioxide layer and leave the silicon dioxide sidewall 40.

Figure 4A:
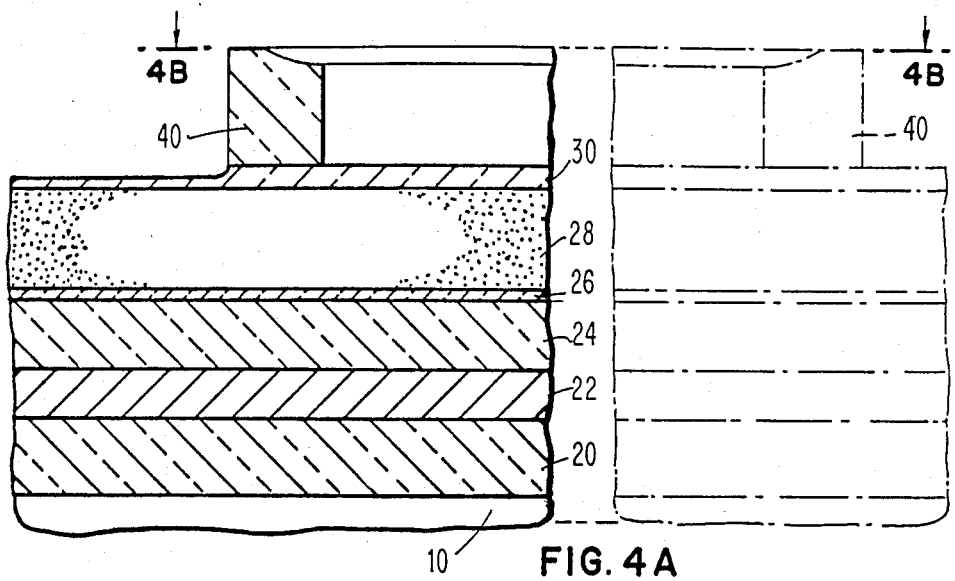

The remaining third silicon nitride layer 34 is removed by a wet chemical etch, such as, $H_3PO_4$ at a temperature of about 180° C. It should be noted that the second silicon nitride layer 30 has purposefully been made thicker than the first and third silicon nitride layers because it is also etched during this wet chemical etch and it is necessary for sufficient silicon nitride of the second layer 30 to remain after the removal of the third silicon nitride layers 34. The second polysilicon layer 32 is removed by for example pyrocatechol-ethylene diamine. This process leaves the silicon dioxide sidewall 40 as seen in FIG. 4A. At this point, if the sidewall layer 40 is too narrow for the purpose intended, a chemical vapor deposited silicon dioxide layer may be formed thereover and a anisotropic reactive ion etching used to remove the horizontal portions of this layer to produce the wider sidewall structure. However, under normal circumstances this process is not necessary.

Figure 4B:
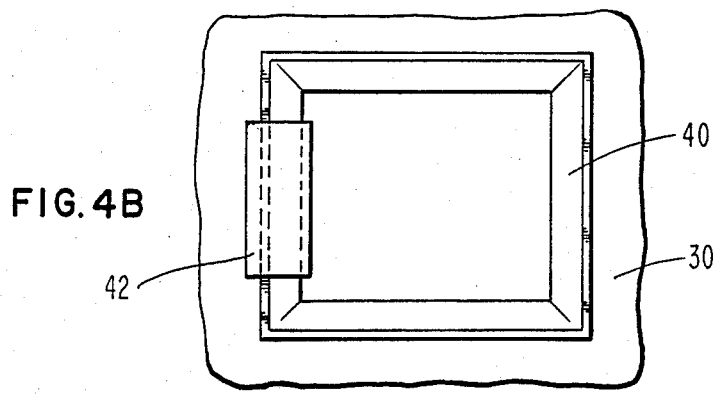
Figure 4C:
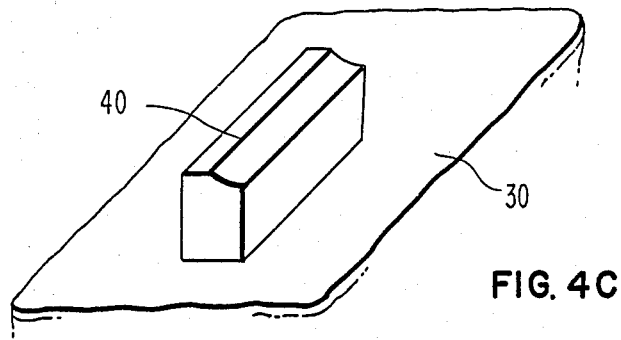
Figure 5:
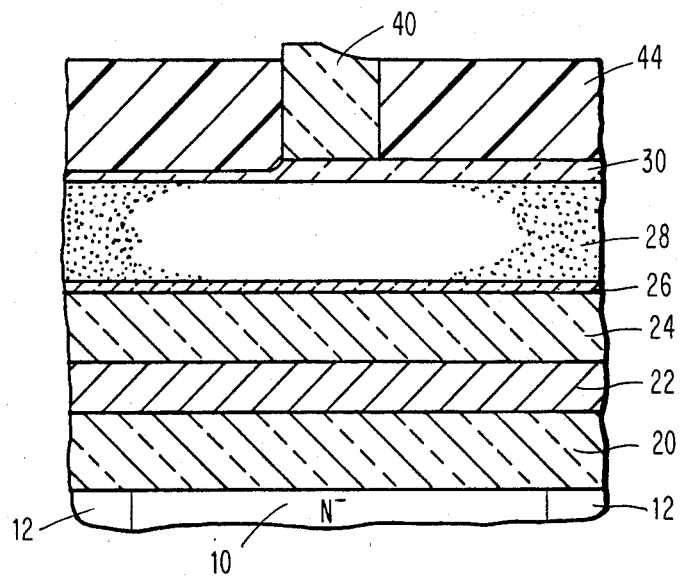
Figure 6:
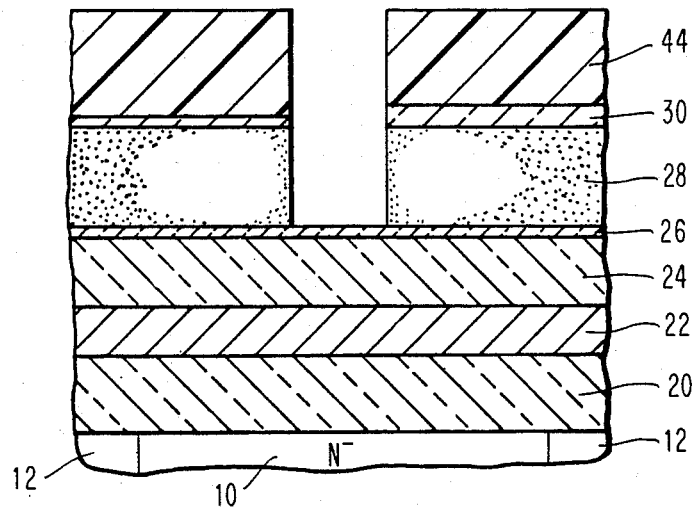

At this point as seen in FIG. 4B, a lithographic mask must be added to trim the silicon dioxide sidewall 40. Otherwise, the sidewall forms a continuous wall, following the closed figure of the resist pattern that created the step. FIG. 4B shows the top view with a mask 42 covering the portion of the sidewall that it is desired to maintain. The sidewall structure 40 is etched where it is not covered by the mask by a suitable etchant such as a buffered HF acid and the mask 42 is removed to produce the FIG. 4C structure. A first organic polymeric layer 44 is applied over the surface 40 and 30 and reactive ion etched to produce the planer surface as shown in FIG. 5 where only the top of the silicon dioxide sidewall 40 reaches above the surface of the polymeric material 44. At this point using the polymeric material 44 as the mask a series of etchants are utilized to remove the first silicon dioxide sidewall layer 40, the silicon nitride layer 30 thereunder and the first polysilicon layer thereunder. The etching is done by a buffered HF acid for $SiO_2$, $CF_4$ reactive ion etching for $Si_3N_4$; and $CCL_2F_2+O_2+N_2$ or $CCl_2F_2+O_2$ reactive ion etching for polysilicon. The result is shown in FIG. 6.

The first polymeric layer 44 is removed by, for example, conventional etching or oxygen ashing. The FIG. 6 structure is now subjected to an oxidation ambient of, for example, wet oxygen at 970° C. to form a second silicon dioxide sidewall 50. If the opening in the first polysilicon layer as shown in FIG. 6 had not been sufficiently wide, a polysilicon over-etch could be used to widen it. Alternatively, the second sidewall oxidation can be done twice with the removal of the first grown sidewall by etching followed by the growth of the second sidewall structure. However, under normal conditions this procedure is not required. The exposed second silicon nitride layer 30 and first silicon nitride layer 26 are removed by a suitable etchant such as $H_3PO_4$ at a temperature of about 180° C. A second organic polymeric layer 52 is formed over the upper surfaces of the structure and hardened. An oxygen reactive ion etching is then used to remove the layer 52 from the surfaces of the first polysilicon layer 28 to produce the FIG. 8A structure.

Figure 7:
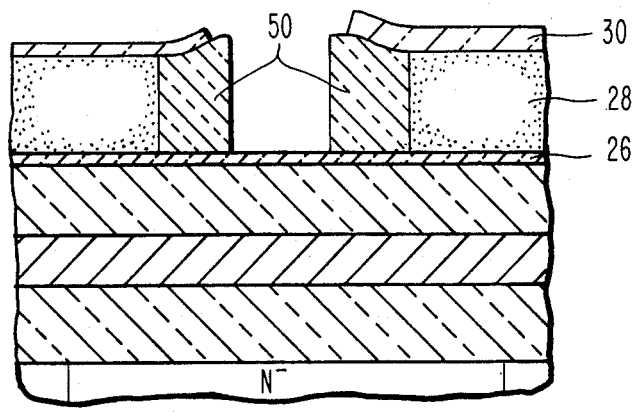
Figure 8A:
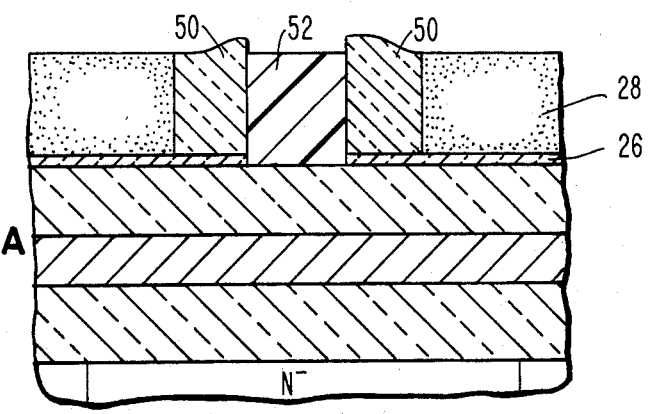
Figure 8B:
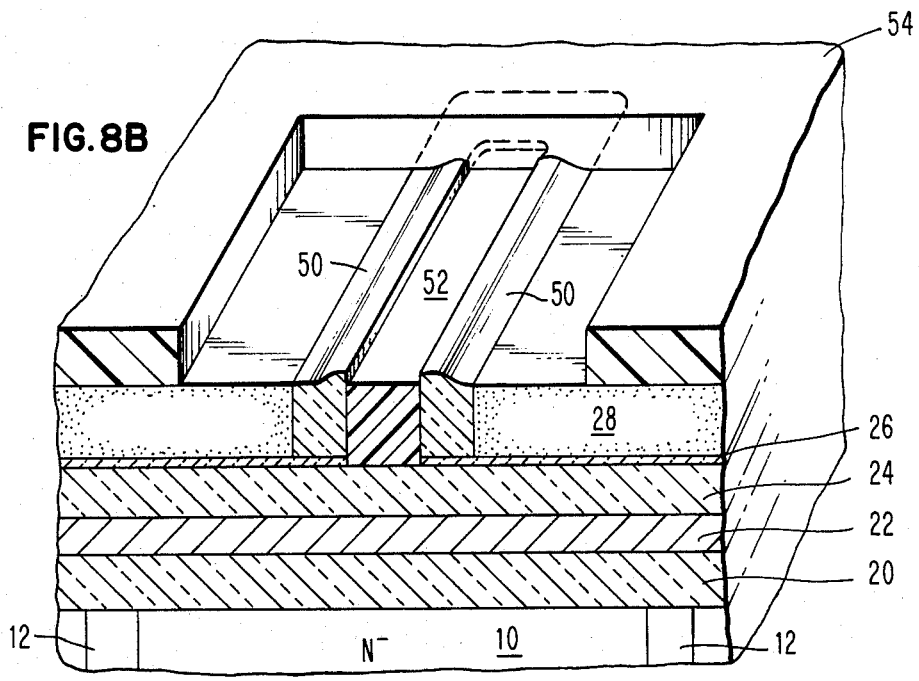
Figure 9:
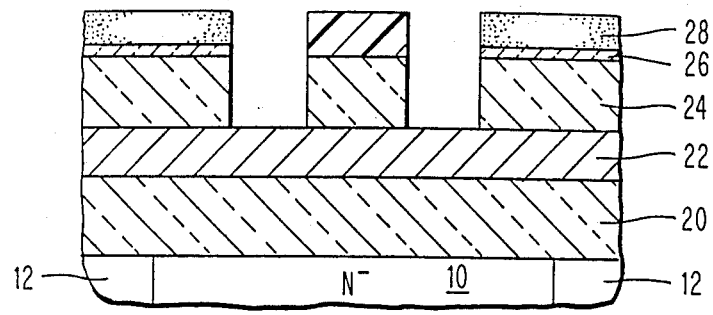

It is now desired to use the two sidewalls 50 of FIG. 8A to etch straight down to the surface of the semiconductor body 10 to form the emitter and collector PN junctions. However, this process can not be done until another mask 54 is used to make sure the emitter 56 and collector 58 will not be shorted together. The problem results from the fact that the second sidewall 50 shown in FIGS. 7, 8A and 8B are connected since the oxidation occurs all the way around the opening in the first polysilicon layer 28 as seen in FIGS. 4B and 6. FIG. 8B illustrates the result of this mask and lithography masking and etching process. Now the etching of the second sidewall 50 as illustrated in FIG. 8B is accomplished, followed by the first silicon nitride layer 26 portion thereunder and the first silicon dioxide layer 24 thereunder. This etching is accomplished by a buffered HF for sidewall $SiO_2$; a $CF_4$ reactive ion etchant for $Si_3N_4$; and $DF_4$ reactive ion etchant for $SiO_2$ layer 24. The result of this process is illustrated in FIG. 9. These two parallel trenches as seen in FIG. 9 may be spaced as closely as about 0.4 micrometers. If the space is narrower than this, it is difficult to fill with polysilicon conformal layer or it may close completely while oxidizing the spacers 50. The advantage of the narrow spacing is better gain in the lateral bipolar transistor since the spacing is the base width.

The second polymeric layer 52 is removed by, for example, oxygen ashing. The first conductive layer 22 and the insulating layer which is typically silicon dioxide 20 are removed by reactive ion by chlorine for example in $CCl_4+O_2$ etchant and reactive ion etching with $CF_4$ with respectively. The first polysilicon layer 28 is then removed by e.g. $CrO_3$ wet etch or pyrocatechol etching. The exposed silicon dioxide layer 24 is removed simultaneously with the etching of the exposed silicon dioxide layer 20 to produce the cross-sectional structure illustrated in FIG. 10A and schematic top view structure shown in FIG. 10B.

Figure 10A:
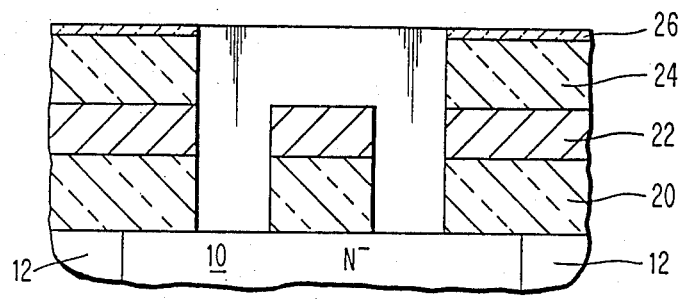
Figure 10B:
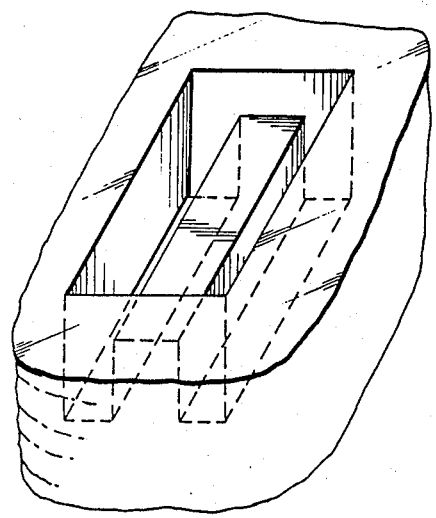
Figure 11:
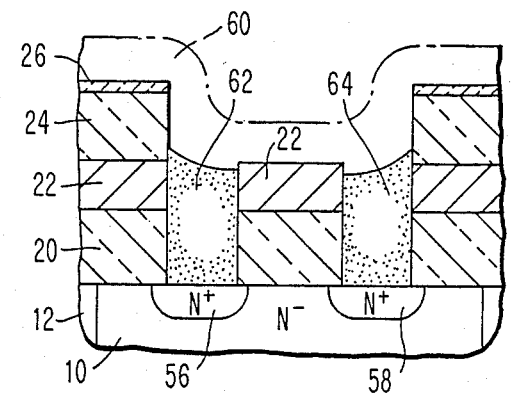
Figure 12:
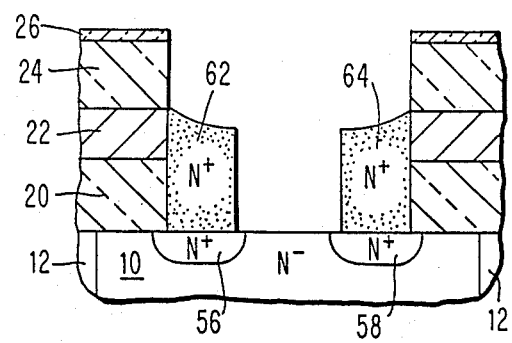

The FIGS. 10A and 10B structure are now exposed to an ion implantation process with an N type dopant, such as, arsenic. The dopant will enter the monocrystalline semiconductor body 10 only at the location of the openings. These openings are not connected by virtue of the removal of the connecting sections of the second silicon dioxide sidewall as described in regard to FIG. 8B. A highly doped polycrystalline silicon layer 60 is deposited to fill the emitter/collector wells and a reactive ion etching is utilized to complete the FIG. 11 structure. The polycrystalline silicon layer thickness as deposited is indicated by the dash line and the vertical conductive layer portion of the polycrystalline silicon 60 remains as indicated by the solid upper lines in FIG. 11. The vertical conformal layers 60, 62 and 64 respectively, which are the remaining portions of layer 60, connect the emitter and collector regions 56 and 58 to the patterned portions of the horizontal first conductive layer 22. FIG. 12 illustrates the result following the removal by etching of the exposed first conductive layer 22 and under layer exposed layer 20 to form the central opening to the designated base region of this lateral NPN transistor.

Figure 13:
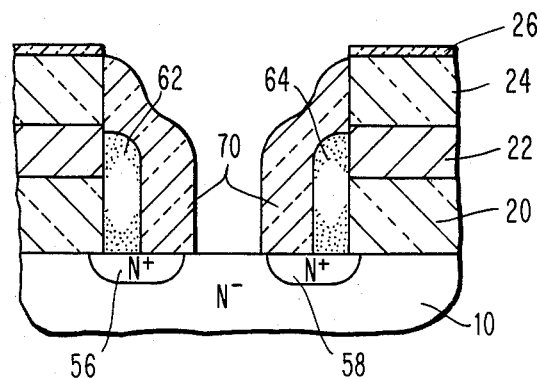

Referring now to FIG. 13, it is now important for the polycrystalline silicon interconnects 62 and 64 to be electrically isolated from the central region where subsequently formed base contact is to be made. To do this, the conformal vertical layers 62 and 64 polycrystalline silicon must be doped to insure an oxidation ratio of about 4:1 for polycrystalline silicon to single crystal silicon. To obtain such a ratio the polycrystalline silicon is doped to about $10^{20}$–$10^{21}$ atoms/cc with phosphorous or arsenic ions. Thermal oxidation under conditions which will insure the differential oxidation rate is now accomplished using, for example, a wet oxygen atmosphere at 800° C. or conventional low temperature, high pressure oxidation can be used. This results in the silicon dioxide isolation coating 70. A plasma etchant of $CF_4$ atmosphere and anisotropic reactive ion etching conditions remove the thin silicon dioxide which was formed upon the monocrystalline silicon body 10. For example, if there was 50 nanometers of silicon dioxide on the monocrystalline silicon body 10, then there are formed about 200 nanometers of silicon dioxide 70 on the polycrystalline silicon. Consequently, after the etching step about 150 nanometers are left upon the polycrystalline silicon layer. If it proves that the silicon dioxide layer 70 is too thin at any point, another chemical vapor deposition of a suitable thickness of silicon dioxide layer, followed by an anisotropic reactive ion etching step can be used to increase the thickness coverage of the layer 70.

Figure 14:
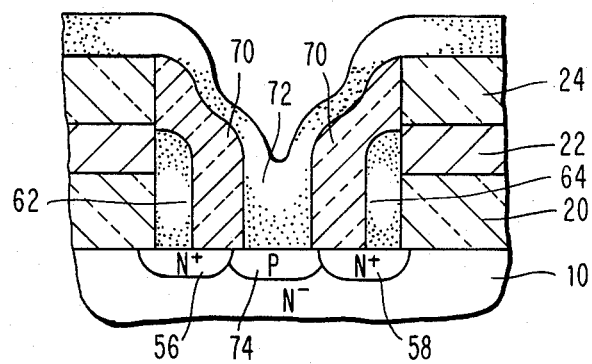
Figure 15A:
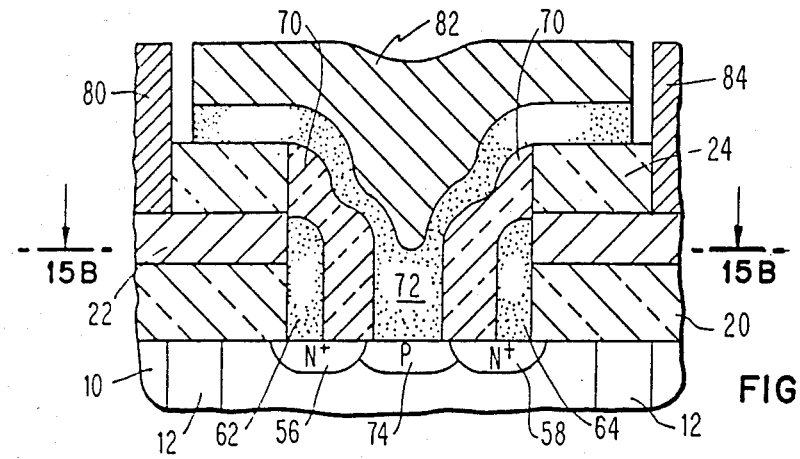
Figure 15B:
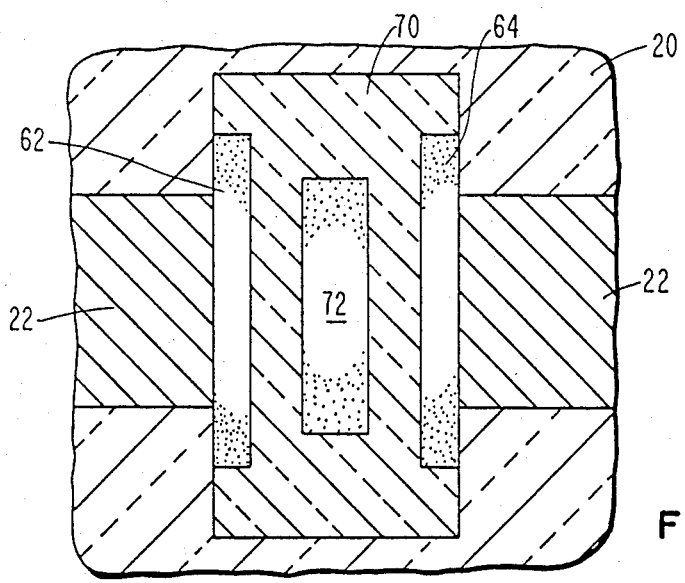

The first silicon nitride layer 26 is removed by wet etching and a layer of polycrystalline silicon 72 as seen in FIG. 14 is deposited into the base opening and over the surface of the wafer. It is implanted with a P type impurity, such as, boron to a concentration of $10^{18}$–$10^{19}$ atoms/c. Alternatively a direct ion implant of the base may be done before the polysilicon layer 72 deposition. The polysilicon layer 72 is deposited and ion implanted to its desired conductivity. A drive-in heat treatment is now performed in a range of temperatures of 850° C. to 950° C. to form the P type base region 74 by out-diffusion of the boron impurities from the polycrystalline silicon layer 72. Lithography and etching techniques are utilized to delineate the polycrystalline layer 72 to be located only in the area of the base region. Lithography and etching techniques are utilized to form contact openings through the silicon dioxide layer 24 to the horizontal first conductive layer 22. A blanket deposition of a suitable conductive metal of, for example, a refractory metal, aluminum, aluminum-copper, or the like, over the surface of the structure is made. Other metal contacts may be made by deposition of platinum, or the like, in a reaction with silicon to form metal silicide contact. Lithography and etching is utilized to delineate in this metal layer the desired contact structure to the emitter contact 80, the base contact 82, and the collector contact 84 as seen in FIGS. 15A and 15B. The FIG. 15B is a top view as taken along the cross-section indicated by 15B: 15B of FIG. 15A.

Figure 16:
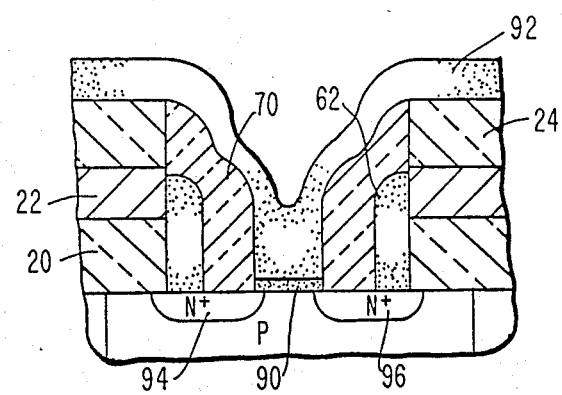
FIG. 16 illustrates by a small schematic cross-section a second embodiment of the present invention involving a very small field effect transistor integrated circuit.

A second embodiment of the present invention may be utilized to form a field effect transistor integrated circuit. In this embodiment the process described in relation to the first embodiment is accomplished through the FIG. 13. At that point a silicon dioxide gate dielectric is thermally grown using a wet oxygen atmosphere at a temperature of, for example, 970° C. to form a dielectric silicon dioxide layer of between about 7 to 50 nanometers. A polycrystalline silicon electrode layer 92 is formed over the surface over the gate dielectric 90. This polycrystalline silicon layer is highly doped to a level of $10^{19}$ to $10^{21}$ atoms/cc with phosphorous or arsenic ions. The N+ source and drain regions 94 and 96 had been formed to the desired doping level for these source/drain regions by out-diffusion from layers 62 and 64 as in the first embodiment. This field effect transistor structure is shown in FIG. 16. Subsequently, the contacts are made to the source and drain regions and the gate dielectric in a similar manner to that described in regard to the first embodiment.

While the invention has been particularly shown and described with reference to the preferred embodiments thereof, it will be understood by those skilled in the art that the foregoing and other changes in form and details may be made without departing from the spirit and scope of the invention. For example, opposite conductivity types can be substituted for the illustrated conductivity types in all cases to form NPN bipolar transistors rather than PNP bipolar transistors described in the embodiments above. Also, the PN regions do not have to form a part of a bipolar transistor but can form a part of other types of devices useful in the integrated circuit or discrete device arts. The semiconductor devices can be incorporated into a wide range of integrated circuits having other types of devices, for example, the lateral PNP bipolar transistor is particularly useful in combination with a vertical NPN bipolar transistor in complementary bipolar circuitry. The lateral PNP process described in the first embodiment can be readily incorporated into a vertical NPN bipolar transistor process so as to form the useful complementary logic integrated circuit devices. The method and structure is of course, adaptable to other semiconductor materials and is not limited to monocrystalline silicon.

What is claimed is:

1. An integrated circuit structure which includes small area lateral bipolar transistors comprising:
    a semiconductor body having surface regions thereof isolated from other such regions by a pattern of isolation;
    at least two narrow width PN junction regions within at least one of said surface regions;
    individual substantially vertical conformal conductive layers, each one being essentially rectangular in vertical cross-section with two long edges, and with two short edges equal in width to the vertical conductive layer thickness, said individual vertical conductive layers making electrical contact to said PN junction regions only with one of said two short edges, and with no other electrical contact being made to said PN junction regions other than through another PN junction region;
    said at least two PN junction regions form the emitter and collector regions of one of said lateral bipolar transistors;
    a base PN junction region between and contiguous to said emitter and collector regions;
    a substantially horizontal conductive layer in electrical contact with an edge of each of said vertical conductive layers and separated from said emitter and collector regions by a first electrical insulating layer;
    a second insulating layer covering said conformal conductive layers and in contact with said emitter and collector regions;
    said horizontal conductive layer is patterned so as to have electrically separated conductive lines from one another;
    a third electrical insulating layer over said patterned horizontal conductive layer;
    an electrical ohmic contact to each of the patterned portions of said horizontal conductive layer through an opening in said third electrical insulating layer which effectively makes electrical contact to said emitter and collector regions through said patterned horizontal conductive layer and said vertical conductive layer; and
    an electrical ohmic contact to said base region which contact is separated from said vertical conductive layers by said second insulating layer.

2. The integrated circuit of claim 1 wherein said semiconductor body is composed of monocrystalline silicon.

3. The integrated circuit of claim 1 wherein said vertical conformal conductive layers are composed of highly doped polycrystalline silicon, said horizontal conductive layers are composed of a refractory metal and said semiconductor body is composed of monocrystalline silicon.

4. The integrated circuit of claim 1 wherein said vertical conformal conductive layers are composed of a highly doped polycrystalline silicon, said horizontal conductive layers are composed of a refractory metal silicide and said semiconductor body is composed of monocrystalline silicon.

5. The integrated circuit of claim 1 wherein said semiconductor body is composed of a P+ type monocrystalline silicon substrate with an N-type epitaxial layer thereover type and said emitter and collector regions are N type.

6. The integrated circuit of claim 1 wherein said insulating layers are silicon dioxide.

7. The integrated circuit of claim 3 or 4 wherein said electrical contact to said base region is a polycrystalline layer and an aluminum layer, and said electrical contacts to said horizontal conductive layers is aluminum.

8. The integrated circuit of claim 3 or 4 wherein the minimum thickness of the said vertical conformal conductors is between about 200 to 500 nanometers and the electrical ohmic contact to said base region is highly conductive polycrystalline silicon which has a minimum width between about 150 to 500.

* * * * *